US008762436B1

(12) United States Patent
Do et al.

(10) Patent No.: US 8,762,436 B1
(45) Date of Patent: Jun. 24, 2014

(54) FREQUENCY SYNTHESIS WITH LOW RESOLUTION RATIONAL DIVISION

(75) Inventors: Viet Do, Carlsbad, CA (US); Simon Pang, San Diego, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 811 days.

(21) Appl. No.: 12/972,255

(22) Filed: Dec. 17, 2010

Related U.S. Application Data

(63) Continuation-in-part of application No. 12/120,027, filed on May 13, 2008, now Pat. No. 8,443,023, which is a continuation-in-part of application No. 11/717,262, filed on Mar. 13, 2007, now Pat. No. 7,826,563, and a continuation-in-part of application No. 11/954,325, filed on Dec. 12, 2007, now Pat. No. 8,346,840.

(51) Int. Cl.
*G06F 7/52* (2006.01)
*G06F 1/02* (2006.01)

(52) U.S. Cl.
USPC .................................... 708/103; 708/270

(58) Field of Classification Search
USPC .................... 708/101, 103, 104, 271, 273
See application file for complete search history.

(56) References Cited

U.S. PATENT DOCUMENTS

| 4,991,188 | A | * | 2/1991 | Perkins | ................ | 377/49 |
|---|---|---|---|---|---|---|
| 5,021,754 | A | * | 6/1991 | Shepherd et al. | ............. | 332/128 |
| 5,781,459 | A | * | 7/1998 | Bienz | ............. | 708/271 |
| 6,779,010 | B2 | * | 8/2004 | Humphreys et al. | ......... | 708/490 |
| 2005/0156772 | A1 | | 7/2005 | Melanson | | |
| 2005/0270201 | A1 | | 12/2005 | Maloberti et al. | | |
| 2007/0241950 | A1 | | 10/2007 | Petilli et al. | | |
| 2008/0297386 | A1 | | 12/2008 | Maloberti et al. | | |
| 2009/0066549 | A1 | | 3/2009 | Thomsen et al. | | |
| 2009/0237284 | A1 | | 9/2009 | Rheinfelder et al. | | |
| 2009/0289823 | A1 | | 11/2009 | Chae et al. | | |
| 2009/0325632 | A1 | | 12/2009 | Gambini et al. | | |
| 2010/0079323 | A1 | | 4/2010 | Miao | | |
| 2010/0103003 | A1 | | 4/2010 | Deval et al. | | |
| 2010/0103013 | A1 | | 4/2010 | Deval et al. | | |
| 2010/0245144 | A1 | | 9/2010 | Robbe et al. | | |
| 2010/0277355 | A1 | | 11/2010 | Chen | | |

OTHER PUBLICATIONS

Kozak et al., "A Pipelined Noise Shaping Coder for Fractional-N Frequency Synthesis", IEEE Transactions on Instrumentation and Measurement, vol. 50, No. 5, Oct. 2001, 1154-116.

\* cited by examiner

*Primary Examiner* — Chuong D Ngo
(74) *Attorney, Agent, or Firm* — Amin, Turocy & Watson, LLP

(57) ABSTRACT

A method is provided for synthesizing signal frequencies using low resolution rational division. A reference frequency value and synthesized frequency value are accepted. In response to dividing the synthesized frequency value by the reference frequency value, an integer value numerator (n) and an integer value denominator (d) are determined, with $n/d=I(N/D)=I+N/D=(I+1)-(D-N)/D)$, and where $N/D<1$. An accumulator creates a sum of $(D-N)$ and a count from a previous cycle, and creates a difference between the sum and the denominator. The sum is compared with the denominator, and a first carry bit is generated. The complement of the first carry bit is added to a first binary sequence, and the first binary sequence is used to generate a k-bit quotient. The k-bit quotient is subtracted from $(I+1)$ to generate a divisor.

18 Claims, 14 Drawing Sheets

| Mode | total_contribution[4:0] | total_contribution_values |
|---|---|---|
| First Order | contribution1 = $c_1[n]$ | 0,1 |
| Second Order | contribution1 + contribution2 = $c_1[n] + c_2[n] - c_2[n-1]$ | -1,0,1,2 |
| Third Order | contribution1 + contribution2 + contribution3 = $c_1[n] + c_2[n] - c_2[n-1] + c_3[n] - 2c_3[n-1] + c_3[n-2]$ | -3,-2,-1,0,1,2,3,4 |
| Fourth Order | contribution1 + contribution2 + contribution3 + contribution4 = $c_1[n] + c_2[n] - c_2[n-1] + c_3[n] - 2c_3[n-1] + c_3[n-2] + c_4[n] - 3c_4[n-1] + 3c_4[n-2] - c_4[n-3]$ | -7,-6,-5,-4,-3,-2,-1,0,1,2,3,4,5,6,7,8 |

FIG. 2
(Prior Art)

FREQUENCY SYNTHESIS WITH LOW RESOLUTION RATIONAL DIVISION

RELATED APPLICATIONS

This application is a continuation-in-part of an application entitled, FREQUENCY SYNTHESIS RATIONAL DIVISION, invented by Viet Do et al., Ser. No. 12/120,027, filed May 13, 2008, now U.S. Pat. No. 8,443,023, which is a Continuation-in-Part of the following applications:

application entitled, HIGH SPEED MULTI-MODULUS PRESCALAR DIVIDER, invented by An et al., Ser. No. 11/717,262, filed Mar. 13, 2007, now U.S. Pat. No. 7,826,563; and application entitled, FLEXIBLE ACCUMULATOR FOR RATIONAL DIVISION, invented by Do et al., Ser. No. 11/954,325, filed Dec. 12, 2007, now U.S. Pat. No. 8,443,023. All the above-referenced applications are incorporated herein by reference.

BACKGROUND OF THE INVENTION

1. Field of the Invention

This invention generally relates to a phase-locked loop (PLL) frequency synthesis system and, more particularly, to a frequency synthesis, low resolution, rational number frequency division system, such as might be used in a PLL.

2. Description of the Related Art

Conventional fractional-N frequency synthesizers use fractional number decimal values in their PLL architectures. Even synthesizers that are conventionally referred to as "rational" frequency synthesizers operate by converting a rational number, with an integer numerator and integer denominator, into resolvable or approximated fractional numbers. These frequency synthesizers do not perform well because of the inherent fractional spurs that are generated in response to the lack of resolution of the number of bits representing the divisor in the feedback path of the frequency synthesizer.

FIG. 1 is a schematic block diagram depicting an accumulator circuit capable of performing a division operation (prior art). As noted in "A Pipelined Noise Shaping Coder for Fractional-N Frequency Synthesis", by Kozak et al., IEEE Trans. on Instrumentation and Measurement, Vol. 50, No. 5, October 2001, the depicted $4^{th}$ order device can be used to determine a division ratio using an integer sequence.

The carry outs from the 4 accumulators are cascaded to accumulate the fractional number. The carry outs are combined to reduce quantization noise by adding their contributions are follows:

contribution $1=c1[n]$:
contribution $2=c2[n]\cdot c2[n-1]$;
contribution $3=c3[n]\cdot 2c3[n-1]+c3[n-2]$;
contribution $4=c4[n]-3c4[n-1]+3c4[n-2]-c4[n-3]$;

where n is equal to a current time, and (n−1) is the previous time, Cx[n] is equal to a current value, and Cx[n−1] is equal to a previous value.

FIG. 2 shows the contributions made by the accumulator depicted in FIG. 1 with respect to order (prior art). A fractional number or fraction is a number that expresses a ratio of a numerator divided by a denominator. Some fractional numbers are rational—meaning that the numerator and denominator are both integers. With an irrational number, either the numerator or denominator is not an integer (e.g., n). Some rational numbers cannot be resolved (e.g., 10/3), while other rational numbers may only be resolved using a large number of decimal (or bit) places. In these cases, or if the fractional number is irrational, a long-term mean of the integer sequence must be used as an approximation.

The above-mentioned resolution problems are addressed with the use of a flexible accumulator, as described in parent application Ser. No. 11/954,325. The flexible accumulator is capable of performing rational division, or fractional division if the fraction cannot be sufficiently resolved, or if the fraction is irrational. The determination of whether a fraction is a rational number may be trivial in a system that transmits at a single frequency, especially if the user is permitted to select a convenient reference clock frequency. However, modern communication systems are expected to work at a number of different synthesized frequencies using a single reference clock. Further, the systems must be easily reprogrammable for different synthesized frequencies, without changing the single reference clock frequency.

While it may be possible to resolve almost any fraction using rational division, practically, there are limits to the size of registers. That is, given the number of bit positions carried in a register, or series or registers, the numerator of some fractions may be resolved with more bits than there are bit positions. In that case, even a rational division system must truncate bits or make approximations, which result in PLL frequency jitter.

It would be advantageous if a means existed for determining a divisor in response to knowing the reference clock frequency and the desired synthesized frequency value. It would be advantageous if this means could determine if the divisor is a rational number. Further, it would be advantageous if the means could calculate the divisor in the form of a fraction that can be input into a flexible accumulator. Finally, it would be advantageous if a means existing for resolving rational division numerators with a minimum number of bits.

SUMMARY OF THE INVENTION

In frequency synthesis applications, there is often a need to use a single reference clock frequency to create multiple output frequencies, where the ratio between output frequency and reference frequency includes a fractional number. The present invention accumulator permits the use of a true rational number as the dividend and divisor, to avoid the use of approximations when the rational number can only be resolved (forming a repeating sequence) using a large number of bit places. The system provides a solution to PLL frequency synthesis by calculating the divisor needed for utilizing these flexible accumulators to perform either rational or fractional division in the feedback path of the PLL. The system disclosed herein also compares the number of bits in the numerator calculated for rational division to a threshold. If the threshold is exceeded, the system uses complementing functions to reduce the bit resolution needed to achieve the identical result.

Accordingly, a method is provided for synthesizing signal frequencies using low resolution rational division in a frequency synthesis device. The frequency synthesis device accepts a reference frequency value and a synthesized frequency value. In response to dividing the synthesized frequency value by the reference frequency value, an integer value numerator (n) and an integer value denominator (d) are determined. The ratio of n/d is reduced to an integer (I) and a ratio of N/D, where $n/d=I(N/D)=I+N/D=(I+1)-(D-N)/D)$, and where $N/D<1$. In a low resolution (complement) mode, a first flexible accumulator creates a binary first sum of (D−N) and a binary first count from a previous cycle, and creates a binary first difference between the first sum and the denominator. The first sum is compared with the denominator, and in response to the comparing, a first carry bit is generated. In the low resolution mode, the complement of the first carry bit is added to a first binary sequence, and the first binary sequence is used to generate a k-bit quotient. In the low resolution mode the k-bit quotient is subtracted from (I+1) to generate a divisor.

Initially, a resolution threshold of X bits is established. The steps of creating the first sum of (D−N) and the first count, adding the complement of the first carry bit, and subtracting the k-bit quotient from (I+1) are performed if N is resolved with greater than X bits. Alternatively, if N is resolved with X or fewer bits, a binary first sum of N and the binary first count from the previous cycle is created, the first carry bit is added to a first binary sequence, and the k-bit quotient is added to I to generate the divisor.

Additional details of the above-described method and frequency synthesis system for low resolution rational division are presented below.

BRIEF DESCRIPTION OF THE DRAWINGS

FIG. 2 shows the contributions made by the accumulator depicted in FIG. 1 with respect to order (prior art).

DETAILED DESCRIPTION

Figure 1:
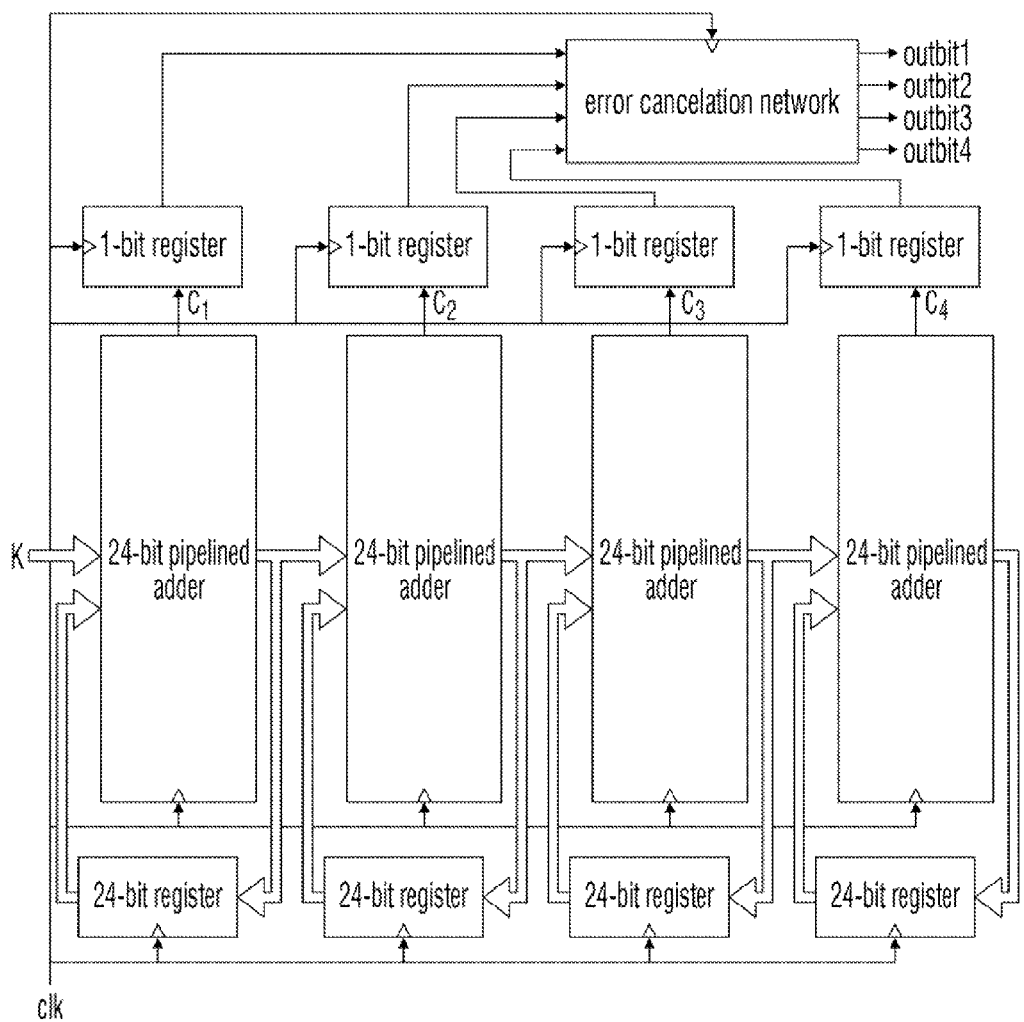
FIG. 1 is a schematic block diagram depicting an accumulator circuit capable of performing a division operation (prior art).

Various embodiments are now described with reference to the drawings. In the following description, for purposes of explanation, numerous specific details are set forth in order to provide a thorough understanding of one or more aspects. It may be evident, however, that such embodiment(s) may be practiced without these specific details. In other instances, well-known structures and devices are shown in block diagram form in order to facilitate describing these embodiments.

As used in this application, the terms "processor", "processing device", "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Various embodiments will be presented in terms of systems that may include a number of components, modules, and the like. It is to be understood and appreciated that the various systems may include additional components, modules, etc. and/or may not include all of the components, modules etc. discussed in connection with the figures. A combination of these approaches may also be used.

The various illustrative logical blocks, modules, and circuits that have been described may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor. The processor and the storage medium may reside in an ASIC. The ASIC may reside in the node, or elsewhere. In the alternative, the processor and the storage medium may reside as discrete components in the node, or elsewhere in an access network.

Figure 3:
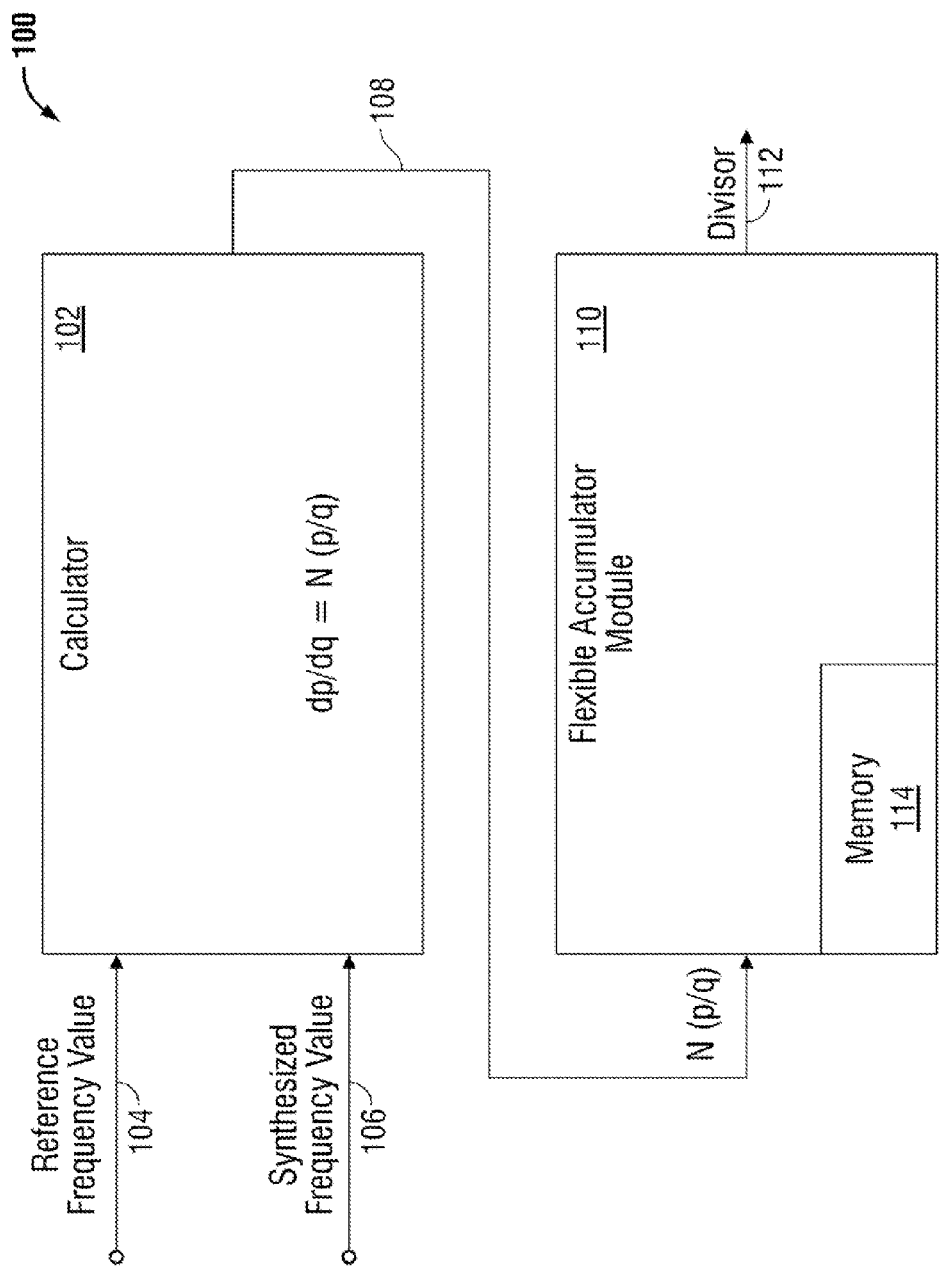
FIG. 3 is a schematic block diagram depicting a system for synthesizing signal frequencies using rational division.

FIG. 3 is a schematic block diagram depicting a system for synthesizing signal frequencies using rational division. The system 100 comprises a calculator 102 having an input on line 104 to accept a reference frequency value and an input on line 106 to accept a synthesized frequency value. The calculator 102 divides the synthesized frequency value by the reference frequency value, and determines an integer value numerator (dp) and an integer value denominator (dq). The calculator 102 reduces the ratio of dp/dq to an integer N and a ratio of p/q (dp/dq=N(p/q)), where p/q<1 (decimal). The calculator 102 supplies N(p/q), where p is a numerator and q is a denominator, at an output on line 108. A flexible accumulator module 110 has an input on line 108 to accept N(p/q) and an output on line 112 to supply a divisor. For example, the calculator 102 may supply an n-bit binary numerator and an (n+1)-bit binary denominator. The divisor may be stored in a tangible memory medium (e.g., random access memory (RAM) or non-volatile memory) for subsequent use, as described below. Note: in the context of FIGS. 10 through 13 described below, N(p/q)=I(N/D).

Figure 4:
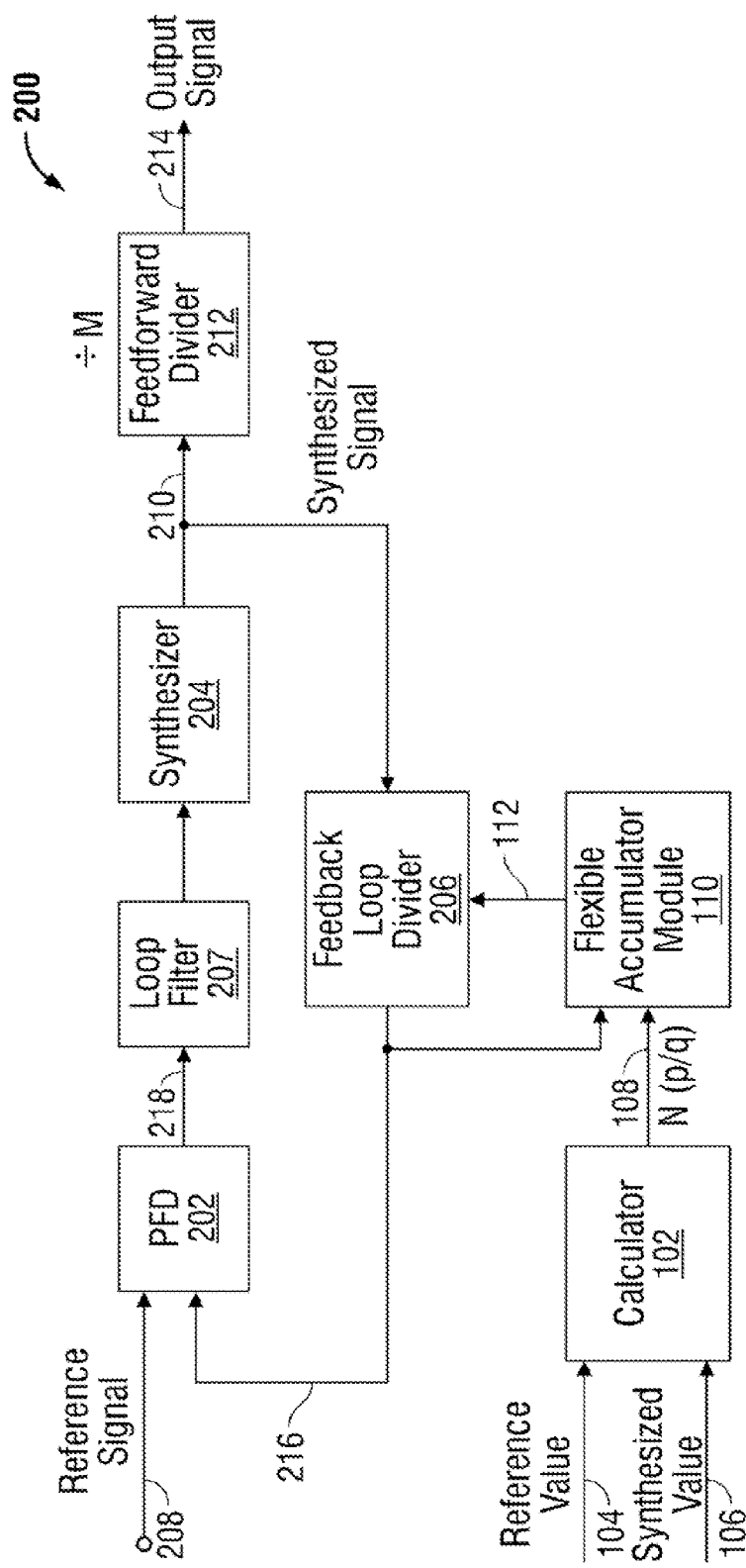
FIG. 4 is a schematic block diagram depicting the system of FIG. 3 is the context of a phase-locked loop (PLL).

FIG. 4 is a schematic block diagram depicting the system of FIG. 3 is the context of a phase-locked loop (PLL) 200. The PLL 200 includes a phase/frequency detector (PFD) 202, a frequency synthesizer 204, and a feedback loop divider 206. Typically, a PLL may also include a loop filer and charge pump 207. The PFD 202 accepts a reference signal on line 208 having a frequency equal to the reference frequency value. The frequency synthesizer 204 generates a synthesized signal on line 210 having a frequency equal to the synthesized frequency value. The flexible accumulator module 110 sums N with a k-bit quotient, creates the divisor, and supplies the divisor to the feedback loop divider 206 on line 112.

Figure 5:
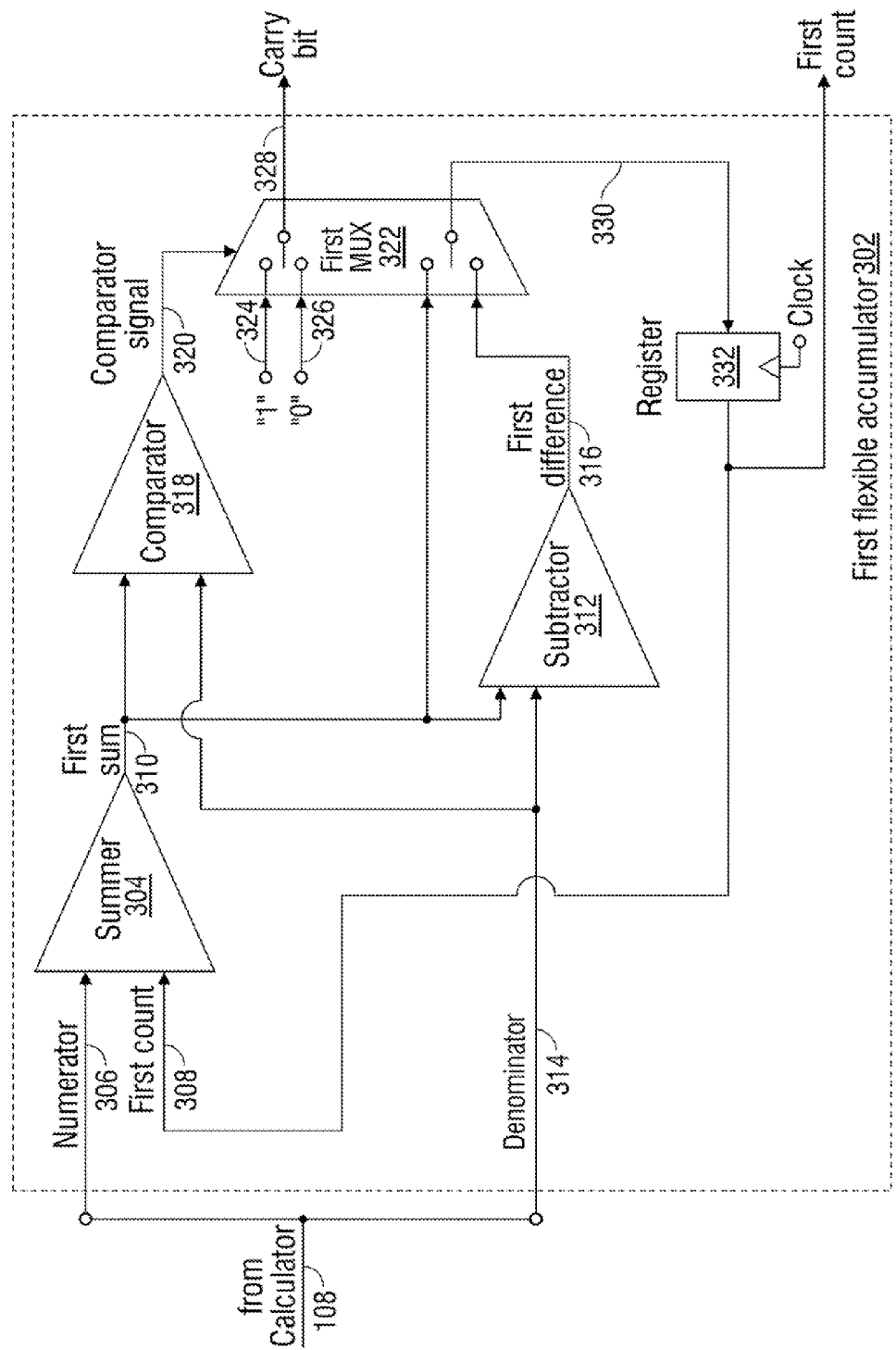
FIG. 5 is a schematic block diagram depicting a first flexible accumulator of the flexible accumulator module.

FIG. 5 is a schematic block diagram depicting a first flexible accumulator of the flexible accumulator module. A flexible accumulator is capable of either rational or fractional division. As explained in more detail below, rational division relies upon the use of a numerator (dividend) and a denominator (divisor) that are used to form a true rational number. That is, the numerator and denominator are integer inputs to the flexible accumulator. Alternately stated, the input need not be a quotient derived from a numerator and denominator. The first flexible accumulator 302 includes a first summer 304 having an input on line 306 to accept a binary numerator (p). Summer 304 has an input on line 308 to accept a binary first count from a previous cycle and an output on line 310 to supply a binary first sum of the numerator and the first count.

A first subtractor 312 has an input on line 314 to accept a binary denominator (q), an input on line 310 to accept the first sum, and an output on line 316 to supply a binary first difference between the first sum and the denominator. Note: the numerator (p) and denominator (q) on lines 306 and 314, respectively, are components of the information supplied by the calculator on line 108. A first comparator 318 has an input on line 310 to accept the first sum, an input on line 314 to accept the denominator, and an output on line 320 to supply a first comparator signal. A first multiplexer (MUX) 322 has an input to accept carry bits. A "1" carry bit is supplied on line 324 and a "0" carry bit is supplied on line 326. The MUX 322 has a control input on line 320 to accept the first comparator signal, and an output on line 328 to supply a first carry bit in response to the first comparator signal.

More explicitly, the first MUX 322 supplies a binary "1" first carry bit on line 328 if the first comparator signal on line 320 indicates that the first sum is greater than the denominator. The MUX 322 supplies a binary "0" first carry bit if the first comparator signal indicates that the first sum is less than or equal to the denominator. The first MUX 322 has an input on line 310 to accept the first sum, an input on line 316 to accept the first difference, and an output on line 330 to supply the first count in response to the comparator signal. Note: the first count from first MUX 322 on line 330 becomes the first count from a subsequent cycle on line 308 after passing through clocked register or delay circuit 332. As explained in more detail below, line 308 may also connected as an output port (count) to another, higher order flexible accumulator.

The first MUX 322 supplies the first difference as the first count on line 308 for the subsequent cycle if the first comparator signal indicates that the first sum is greater than the denominator. The first MUX 322 supplies the first sum as the first count in the subsequent cycle if the first comparator signal indicates that first sum is less than or equal to the denominator. Alternately but not shown, the accumulator may be comprised of two MUX devices, one for selecting the carry bit and one for selecting the first count.

In one aspect, the first summer accepts an n-bit binary numerator on line 306, an n-bit first count on line 308 from the previous cycle, and supplies an (n+1)-bit first sum on line 310. The first subtractor 312 accepts an (n+1)-bit binary denominator on line 314 and supplies an n-bit first difference on line 316.

Typically, first summer 304 accepts the numerator with a value, and the first subtractor 312 accepts the denominator with a value larger than the numerator value. In one aspect, the combination of the numerator and denominator form a rational number. That is, both the numerator and denominator are integers. However, the numerator and denominator need not necessarily form a rational number. Alternately expressed, the first summer 304 may accept an n-bit numerator that is a repeating sequence of binary values, or the numerator may be the most significant bits of a non-repeating sequence. The non-repeating sequence may be represented by r, an irrational number or a rational number that cannot be resolved (does not repeat) within a span of n bits. In this aspect, the first subtractor 312 accepts an (n+1)-bit denominator with a value equal to decimal $2^{(n+1)}$. Additional details of the flexible accumulator module can be found in parent application Ser. No. 11/954,325.

Figure 6:
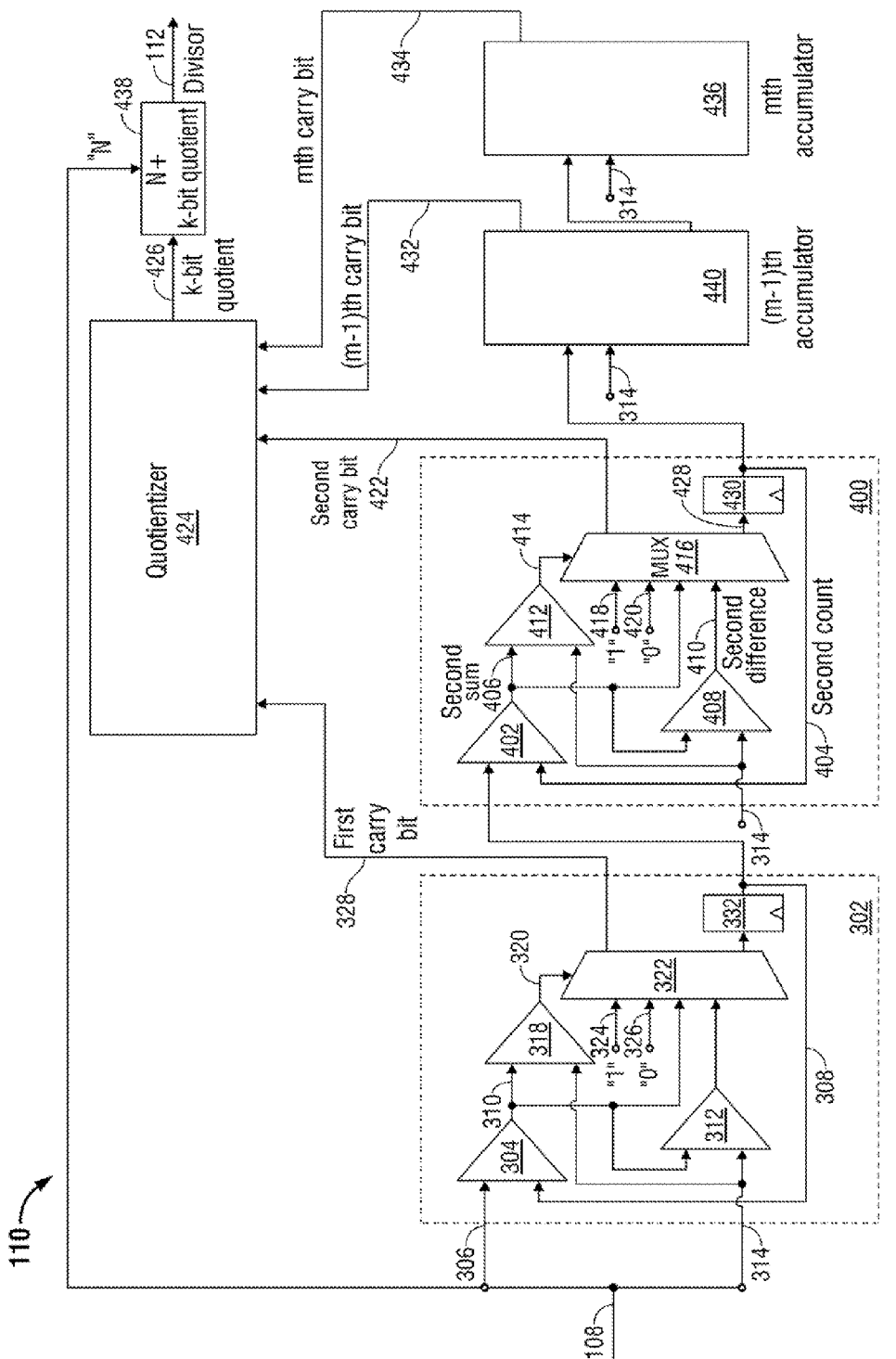
FIG. 6 is a schematic block diagram depicting the flexible accumulator module as a plurality of series-connected flexible accumulators.

FIG. 6 is a schematic block diagram depicting the flexible accumulator module as a plurality of series-connected flexible accumulators. Generally, the flexible accumulator module generates a binary sequence from each flexible accumulator and uses a plurality of binary sequences to generate the k-bit quotient.

A quotientizer 424 has an input on line 328 to accept the first binary sequence, an input on line 422 to accept the second binary sequence, and an output on line 426 to supply a k-bit quotient generated from the first and second binary sequences. In total, the flexible accumulator module 110 comprises m flexible accumulators, including an (m−1)th accumulator 440 and an mth accumulator 436. In this example, m=4. However, the module 110 is not limited to any particular number of flexible accumulators. Thus, the quotientizer has inputs 328, 422, 432, and 434 to accept m=4 binary sequences and the output 426 supplies a k-bit quotient generated from the m binary sequences. In one aspect, the quotientizer 424 derives the quotient as shown in FIGS. 1 and 2, and as explained below. Circuit 438 sums the k-bit quotient on line 426 with the integer N to supply the divisor on line 112.

A fourth order system, using four series-connected accumulators has been depicted as an example. However, it should be understood that the system is not limited to any particular number of accumulators. Although the above-described values have been defined as binary values, the system could alternately be explained in the context of hexadecimal or decimal numbers.

Figure 7:
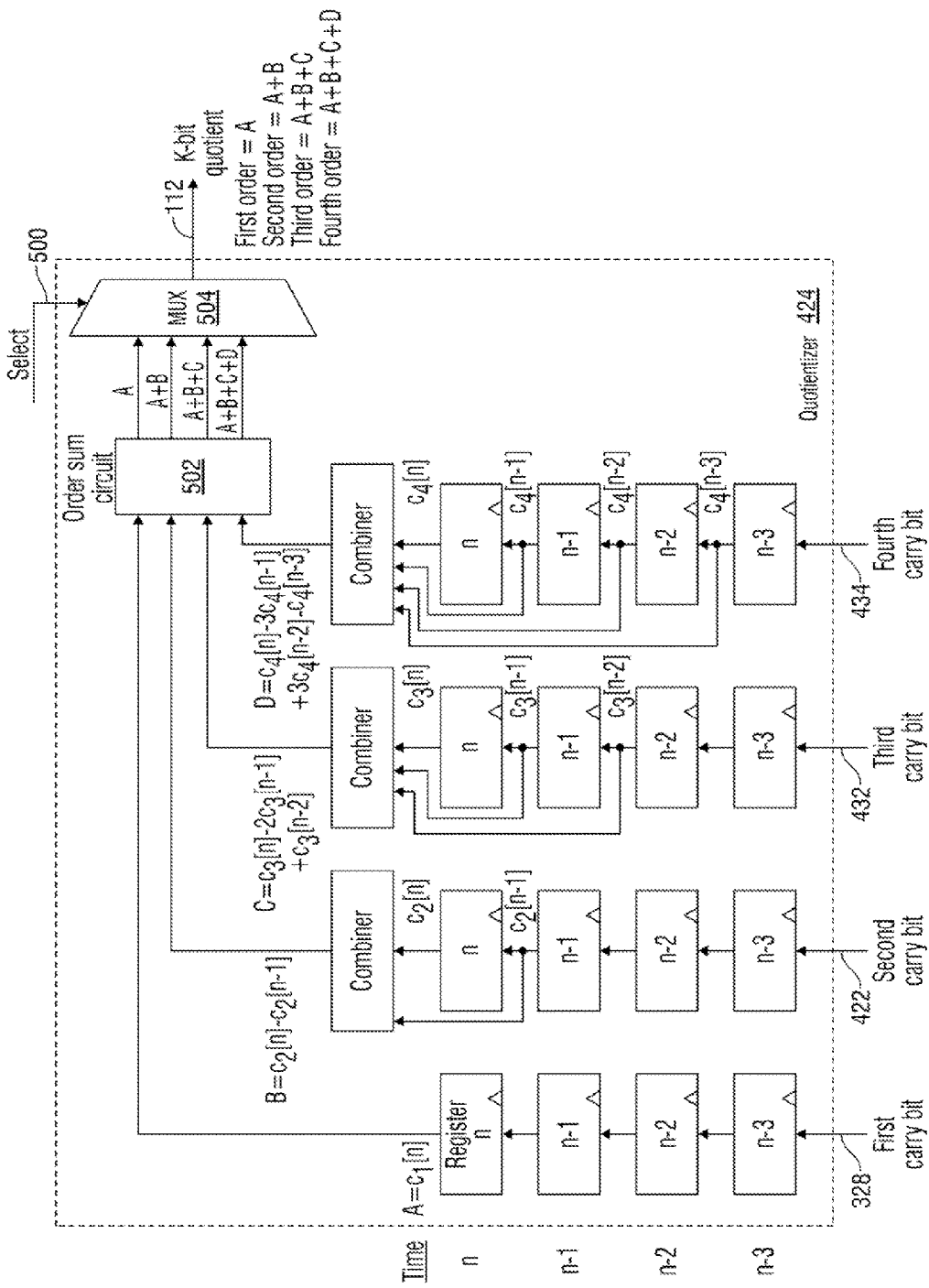
FIG. 7 is a schematic block diagram depicting the quotientizer of FIG. 6 in greater detail.

FIG. 7 is a schematic block diagram depicting the quotientizer of FIG. 6 in greater detail. Returning to the calculation of the quotient, the number of bits required from each contribution block is different. From FIG. 2 it can see that each order requires a different number of bits. For example, the first contribution (contribution 1) has only two values: 0 and 1. So, only 1 bit is needed. There is no need for a sign bit, as the value is always positive. The second contribution has possible 4 values: −1, 0, 1, and 2. So, 3 bits are needed, including 1 sign bit. The third contribution has 7 values: −3 to 4. So, 4 bits are required, including 1 sign bit. The fourth contribution has 15 values: −7 to 8. So, 5 bits are required, including 1 sign bit.

To generalize for "k" (the k-bit quotient), Pascal's formula may be used to explain how many bits is necessary for each contribution (or order). For an m-order calculator, there are m flexible accumulators and in binary sequences. Each binary sequence (or carry bit) is connected to the input of one of the m sequences of shift registers. Thus, there are m signals combined from the m shift register sequences, corresponding to the m-binary sequences (or m-th carry bit) found using Pascal's formula. A 4-order calculator is shown in FIG. 7, with 4 shift register (delay) sequences, with each shift register sequence including 4 shift registers.

As a simplified alternative, each contribution may be comprised of the same number of bits, k, which is the total contribution (or order) for all contributions. These k-bit contributions are 2 complement numbers. In FIG. 2, k is equal to 5 bits [4:0].

The accumulator does not generate a sign bit. However, the carry outs from the accumulators are modulated in the calculator and the sign bit is generated. For example, the $2^{nd}$ order contribution=c2[n]−c2[n−1]. If c2[n]=0 and c2[n−1]=1, then the $2^{nd}$ order contribution=0−1=−1. Similarly, the third order contribution=c3[n]−2c3[n−1]+c3[n−2]. If c3[n]=0, c3[n−1]= 1, and c3[n−2]=0, then the $3^{rd}$ order contribution=0−2×1+ 0=−2. For the $4^{th}$ order contribution=c4[n]−3c4[n−1]+3c4 [n−2]−c4[n−3]. If c4[n]=0, c4[n−1]=1, c4[n−2]=0, and c4[n−3]=1, then the $4^{th}$ order contribution=0−3×1+3×0−1=−4. These contributions are added together in the "order sum circuit" 502 on the basis of order, and the order is chosen using MUX 504 and the select signal on line 500. FIG. 7 depicts one device and method for generating a quotient from accumulator carry bits. However, the system of FIG. 6 might also be enabled using a quotientizer that manipulates the accumulator carry bits in an alternate methodology.

Returning to FIG. 4, in one aspect the calculator 102 defines a resolution limit of j radix places, sets q=dq, and determines p. The calculator 102 supplies p and q to a flexible accumulator module 110 enabled for rational division when p can be represented as an integer using j, or less, radix places. Alternately, the calculator 102 supplies N(r/q) to a flexible accumulator module enabled for fractional division, where r is a non-resolvable number, when p cannot be represented as an integer using j radix places. When enabled for fractional division, r is supplied as the "numerator" on line 306 (see FIG. 5). Then, the "denominator" on line 314 is represented as an integer with a value larger than the fractional number. For example, the fractional number of line 306 may be an unresolved 31-bit binary number and the integer on line 314 may be a 32-bit number where the highest order radix place is "1" and all the lower orders are "0". Alternately stated, r may be a 31-bit non-resolvable numerator, and q a 32-bit denominator with a value equal to decimal $2^{32}$. In one aspect, r is "rounded-off" to a resolvable value.

In one aspect, the PLL 200 of FIG. 4 includes a feedforward divider 212 to accept the synthesized signal on line 210 and an output on line 214 to supply an output signal having a frequency=(synthesized signal frequency)/M. In this aspect, the flexible accumulator module 110 creates the divisor by summing N, the k-bit quotient, and M. Likewise, the calculator 102 reduces to ratio M(dp/dq)=N(p/q)).

Figure 8:
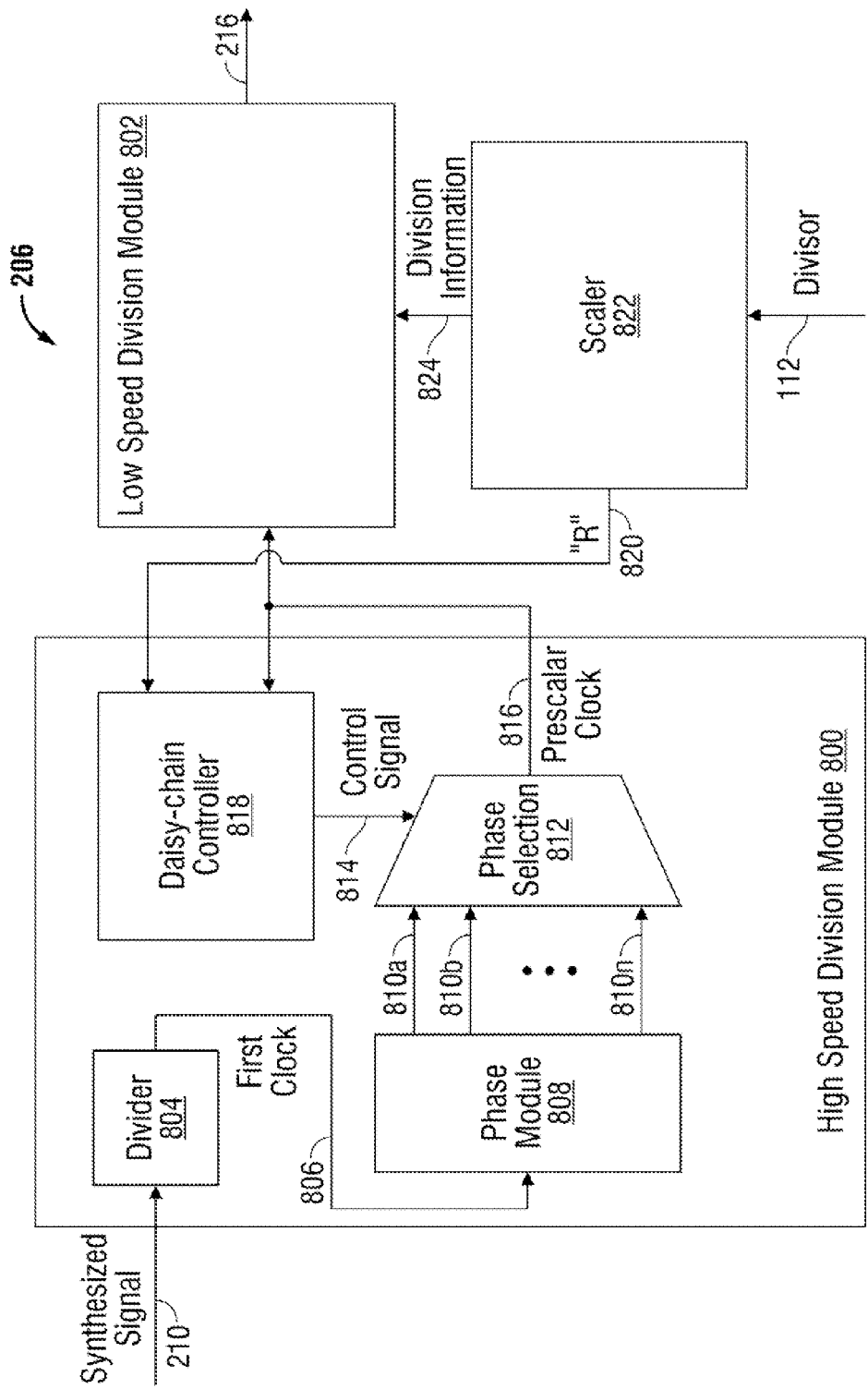
FIG. 8 is a schematic block diagram depicting the feedback loop divider of FIG. 4 is greater detail.

FIG. 8 is a schematic block diagram depicting the feedback loop divider of FIG. 4 in greater detail. The feedback loop divider 206 includes a high-speed division module 800 and a low-speed division module 802. The high-speed module 800 includes a divider 804 having an input on line 210 to accept the synthesized signal and an output on line 806 to supply a first clock signal having a frequency equal to the (synthesized signal frequency)/J. A phase module 808 has an input on line 806 to accept the first clock and an output on lines 810a through 810n to supply a plurality of phase outputs, each having the first clock frequency. Typically, the phase module 808 generates a first clock with a first number of equally-spaced phase outputs. For example, n may be equal to 8, meaning that 8 first clock signals are supplied, offset from the nearest adjacent phase by 45 degrees. A phase selection multiplexer 812 has an input on lines 810a-810n to accept the plurality of first clock phase outputs, an input on line 814 to accept a control signal for selecting a first clock signal phase, and an output on line 816 to supply a prescalar clock with a frequency equal to the (synthesized signal frequency)/R, where R=J·S.

A daisy-chain register controller 818 has an input on line 820 to accept the pre-divisor value R and an output on line 814 to supply the control signal for selecting the first clock phase outputs. A low-speed module 822 has an input on line 816 to accept the prescalar clock and an output on line 216 to supply a divided prescalar clock with a frequency equal to the (divisor/R). A scaler 822 accepts the divisor on line 112, supplies the R value of line 820, and supplies division information to the low speed divider 802 on line 824. Returning briefly to FIG. 4, the PFD 202 compares the divided prescalar clock frequency on line 216 to the reference clock frequency and generates a synthesized signal correction voltage on line 218. In some aspects, the divided prescalar clock signal on line 216 is feedback to the flexible accumulator module 110.

Figure 9:
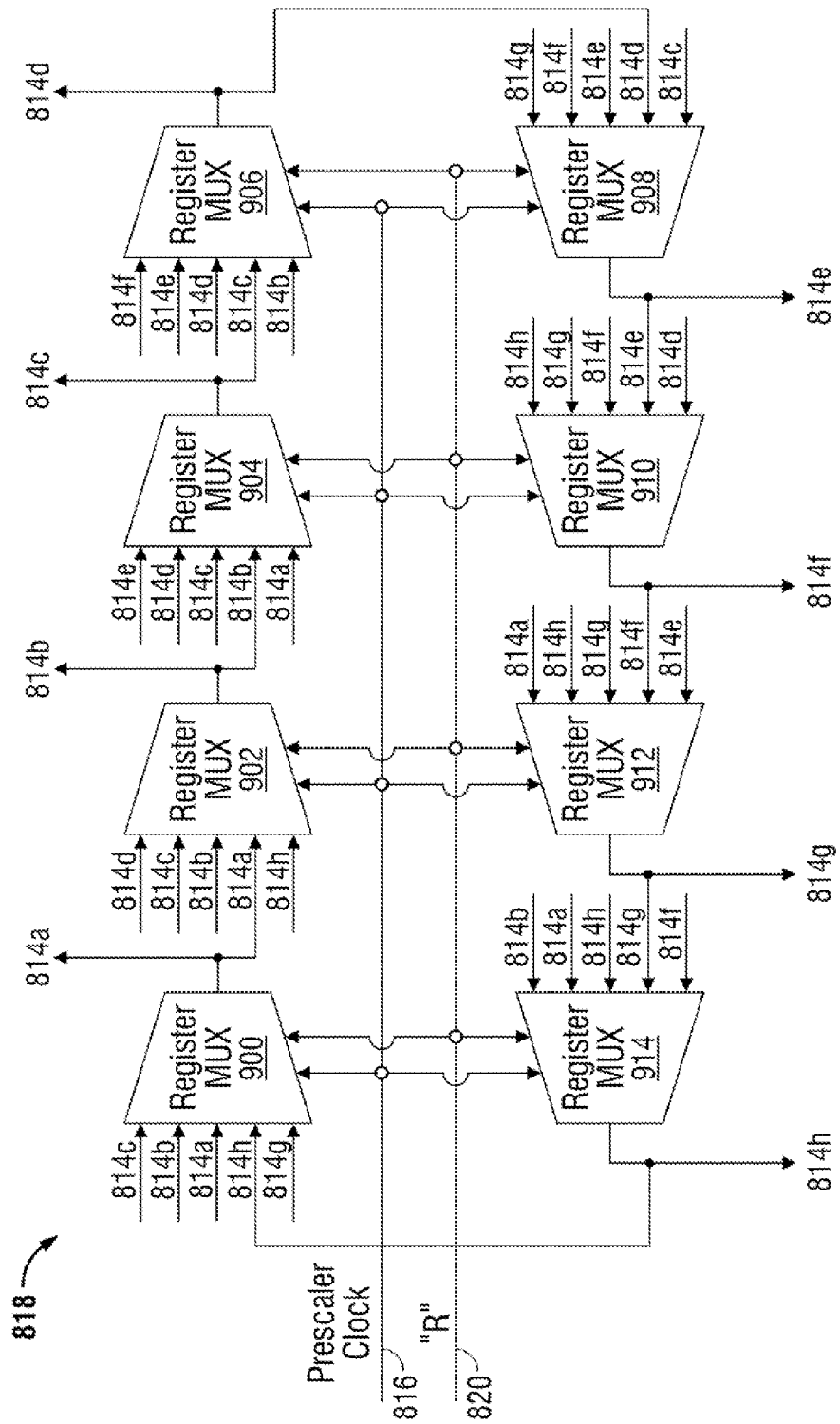
FIG. 9 is a block diagram depicting the daisy-chain controller of FIG. 8 in greater detail.

FIG. 9 is a block diagram depicting the daisy-chain controller of FIG. 8 in greater detail. The daisy-chain register controller 818 accepts the prescalar clock on line 816 as a clock signal to registers 900 through 914 having outputs connected in a daisy-chain. The controller 818 generates a sequence of register output pulses 814a through 814h in response to the clock signals, and uses the generated register output pulses to select the first clock phase outputs.

The daisy-chain register controller 818 iteratively selects sequences of register output pulses until a first pattern of register output pulses is generated. Then, the phase selection multiplexer (816, see FIG. 8) supplies phase output pulses having a non-varying first period, generating a prescalar clock frequency equal to the (first clock frequency)·S, where S is either an integer or non-integer number. Additional details of the high speed divider and daisy-chain controller may be found in parent application Ser. No. 11/717,261.

Figure 10:
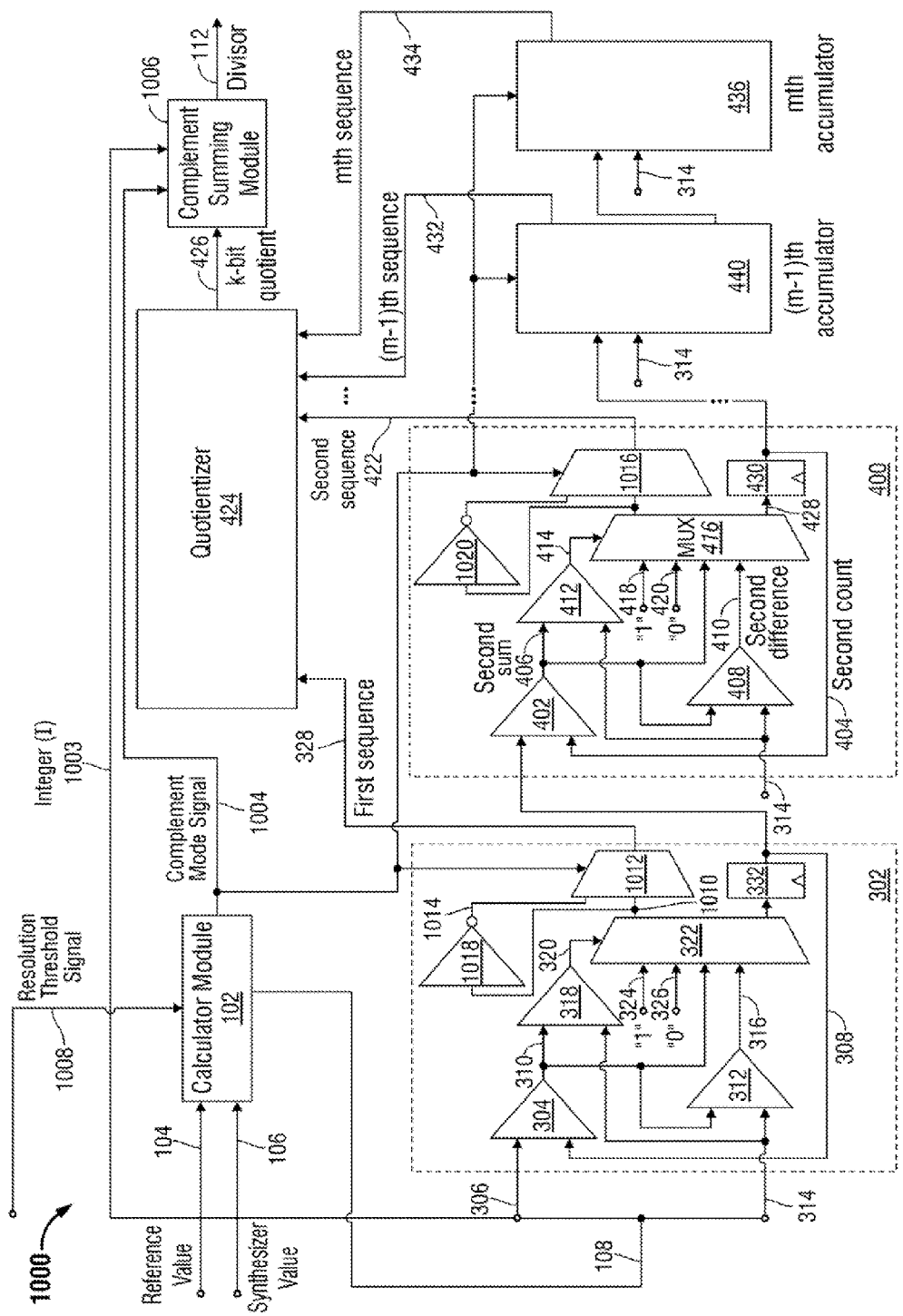
FIG. 10 is a schematic block diagram of a device for synthesizing signal frequencies using low resolution rational division.

FIG. 10 is a schematic block diagram of a device for synthesizing signal frequencies using low resolution rational division. The device 1000 comprises a calculator module or calculator 102 having inputs to accept a reference frequency value on line 104 and a synthesized frequency value on line 106. The calculator module 102 divides the synthesized frequency value by the reference frequency value and determines an integer value numerator (n) and an integer value denominator (d). The calculator module 102 reduces the ratio of n/d to an integer (I) and a ratio of N/D, where n/d=I(N/D)= I+N/D=(I+1)−(D−N)/D), and where N/D<1. The calculator module 102 has an output on line 108 to supply a low resolution ratio and the integer. More explicitly, line 108 is separated into different lines, with the numerator supplied on line 306, the denominator on line 314, and the integer on line 1003. As explained in more detail below, the numerator on line 306 may either be N, or if the resolution of N is too great, (D−N). The calculator module 102 also has an output to supply a complement mode (or non-complement mode) signal on line 1004.

A first flexible accumulator 302 has an input on lines 306 and 314 to accept the low resolution ratio and an input on line 1004 to accept the complement mode signal. In the low resolution or complement mode, the first flexible accumulator 302 creates a binary first sum on line 310, of (D−N) on line 306 (the numerator) and a binary first count from a previous cycle on line 308. The first flexible accumulator creates a binary first difference on line 316 between the first sum on line 310 and the denominator on line 314. Comparator 318 compares the first sum on line 310 with the denominator on line 314, and a first carry bit is generated in response to the comparing. In response to the complement mode signal on line 1004, the complement of the first carry bit is added to a first binary sequence on line 328. A quotientizer 424 has an input on line 328 to accept the first binary sequence and an output on line 426 to supply a k-bit quotient.

A complement summing module 1006 has an input on line 426 to accept the k-bit quotient, an input on line 1003 to accept the integer, and an input on line 1004 to accept the complement mode signal. The complement summing module 1006 subtracts the k-bit quotient from (I+1) to supply a divisor at an output on line 112, in response to the complement mode signal on line 1004.

In one aspect, the calculator module 102 has an input on line 1008 to accept a resolution signal for establishing a resolution threshold of X bits. The calculator module 102 supplies the complement mode signal on line 1004 in response to the numerator being resolved with greater than X bits. In contrast, the calculator module 102 supplies a non-complement mode signal on line 1004 in response to the numerator being resolved with X, or fewer bits. In the non-complement mode, the low resolution ratio is N instead of (D−N). That is, N is the numerator instead of (D−N). The first flexible accumulator 302 creates a binary first sum on line 310 of N (line 306) and the binary first count from a previous cycle on line 308, and acids the first carry bit to the first binary sequence on line 328 in response to the non-complement signal. The complement summing module 1006 adds the k-bit quotient on line 426 to I (line 1003), to generate the divisor on line 112, in response to the non-complement signal. In the non-complement mode, the low resolution rational division device 1000 operates essential the same as the system described in FIG. 6, above.

Figure 11:
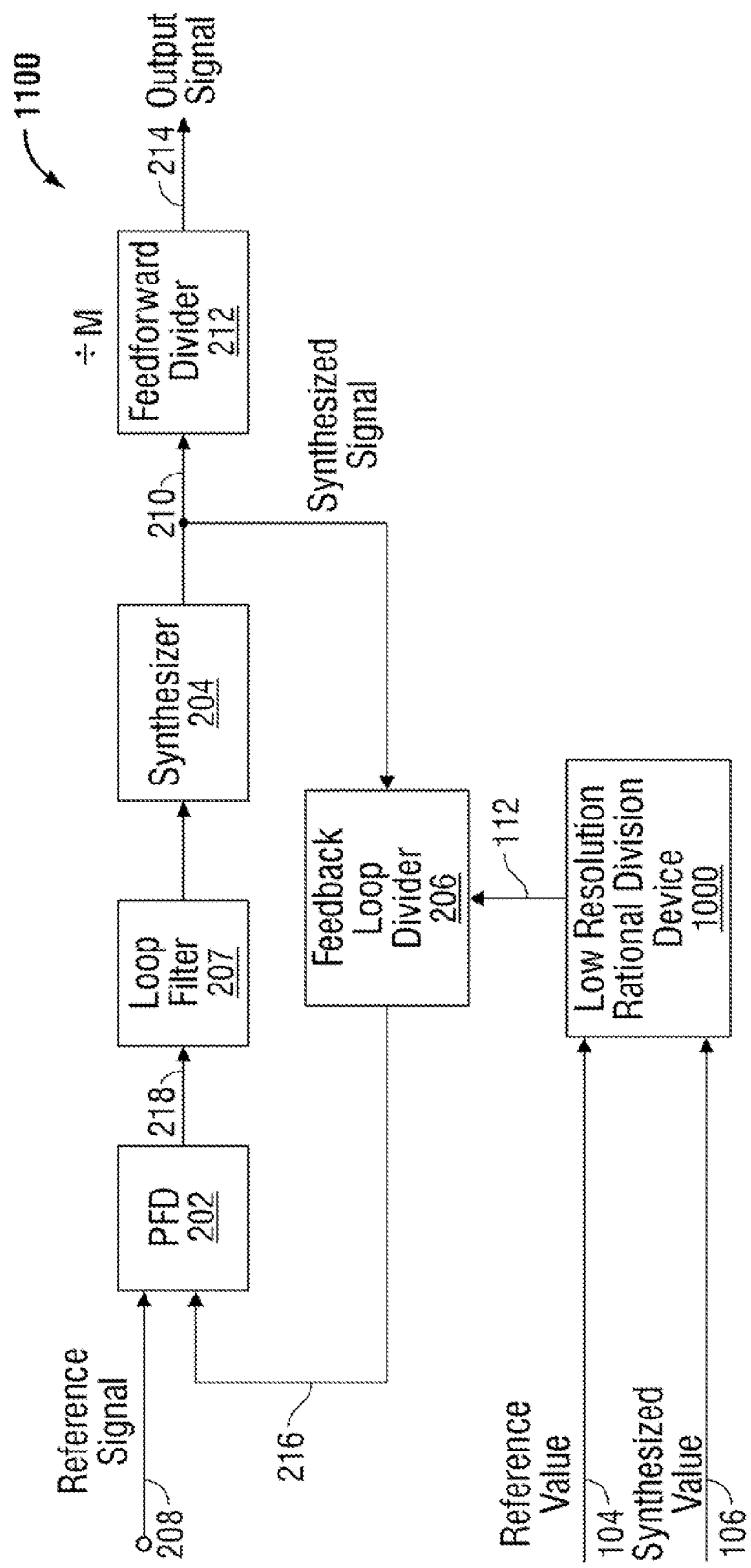
FIG. 11 is a schematic block diagram a phase-locked loop (PLL) using the low resolution rational decision device of FIG. 10.

FIG. 11 is a schematic block diagram of a phase-locked loop (PLL) using the low resolution rational decision device 1000 of FIG. 10. The PLL 1100 includes a phase/frequency detector (PFD) 202, frequency synthesizer 204, and feedback loop divider 206. The PFD 202 accepts a reference signal on line 208 having a frequency equal to the reference frequency value. The frequency synthesizer 204 generates a synthesized signal on line 210 having a frequency nominally equal to the synthesized frequency value on line 106. The feedback loop divider 206 has an input on line 210 to accept the synthesized signal and an input on line 112 to accept the divisor. The feedback loop divider 206 divides the synthesizer signal on line 210 by the divisor on line 112 (I+N/D=(I+1)−(D−N)/D) to supply a clock signal on line 216. The PFD 202 compares the clock signal frequency to the reference frequency on line 208, and in response to the comparison, locks the synthesizer signal on line 210 to the reference signal on line 208.

Returning to FIG. 10, the first flexible accumulator 302 includes a first summer 304 having an input to accept a binary numerator (N or (D−N)), an input on line 308 to accept the first count from a previous cycle, and an output on line 310 to supply the first sum of the numerator and the first count. A first subtractor 312 has an input on line 314 to accept a binary denominator, and input on line 310 to accept the first sum, and an output on line 316 to supply the first difference between the first sum and the denominator. A first comparator 318 has an input on line 310 to accept the first sum, an input on line 314 to accept the denominator, and an output on line 320 to supply a first comparator signal. A first multiplexer (MUX) 322 has an input to accept carry bits ("0" on line 324 and "1" on line 326). a control input on line 320 to accept the first comparator signal, and an output on line 1010 to supply the first carry bit in response to the first comparator signal. A second MUX 1012 has an input on line 1010 to accept the first carry bit, an input on line 1014 to accept the complement of the first carry bit, and a control input on line 1004 to accept the complement mode (or non-complement mode) signal. The second MUX 1012 adds the complement of the first carry bit to the first binary sequence on line 328 in response to a complement mode signal on line 1004, or adds the first carry bit to the first binary sequence in response to the non-complement signal on line 1004.

As in the first flexible accumulator described above in the explanation of FIG. 5, the first flexible accumulator 302 generates a binary "1" first carry bit if the first sum is greater than the denominator, or generates a binary "0" first carry bit if the first sum is less than or equal to the denominator. The first flexible accumulator 302 uses the first difference as the first count if the first sum is greater than the denominator, or uses the first sum as the first count if the first sum is less than or equal to the denominator.

The calculator module 102 generates an n-bit binary numerator on line 306 and an (n+1)-bit binary denominator on line 314. The n-bit numerator (N or (D−N)) is resolved with X or fewer bits. The first flexible accumulator 302 creates an (n+1)-bit first sum of the numerator on line 310, an n-bit first count from the previous cycle on line 308, and an n-bit first difference on line 316.

Typically, the device 1000 includes a plurality of flexible accumulators. Shown is a chain of (m−1) flexible accumulators 400, 436, and 440, linked to the first flexible accumulator 302. "m" is a variable integer not limited to any particular value. Each ith flexible accumulator in the chain accepts an (ith−1) count from a previous cycle and an ith count from the previous cycle. Each ith flexible accumulator creates a binary ith sum of the (ith−1) count and the ith count, creates a binary ith difference between ith sum and the denominator, and compares the ith sum with the denominator. If the ith sum is greater than the denominator, a binary "1" ith carry bit is generated and the ith difference is used as the ith count for a subsequent cycle. If the ith sum is less than or equal to the denominator, a binary "0" ith carry bit is generated and the ith sum is used as the ith count for the subsequent cycle. Finally, either the ith carry bit or the complement of the ith carry bit is added to the ith binary sequence, depending upon whether a complement mode or non-complement mode signal is received. The quotientizer 424 accepts m iteratively generated binary sequences and uses the m binary sequences to generate the k-bit quotient.

Although the above-described systems have been depicted as a combination of connected hardware elements, some aspects parts of the system may be enabled using software instructions stored in memory that are called and performed by a processor or logic-coded state machine device (not shown).

Functional Description

The low resolution rational division device described above is a type of Sigma-Delta modulator, and can be described as:

$\Sigma\Delta[I,N,D]$, with $N<D$ where I: Integer part, N: Numerator part, and D: Denominator. In combination with reference frequency fr, an output frequency, $f_o$ can be generated as follows:

$$f_o = I\frac{N}{D} \times f_r = \left(I + \frac{N}{D}\right) \times f_r = \frac{(I \times D) + N}{D} \times f_r$$

If the operation produces $$\frac{(I \times D) + N}{D},$$

then $f_o$ can be denoted as:

$f_o = \Sigma\Delta[I,N,D]*fr$ and a Complement Sigma-Delta Modulator can be defined as:

$\Sigma\Delta[(1+I),(D-N),D]$

When the Integer part is (I+1), the Nominator part is (D−N), the Denominator part is D, and when the complement mode signal (C) is asserted, then the Complement Sigma-Delta Modulator can be denoted as:

$C\Sigma\Delta[I,N,D] = \Sigma\Delta[(1+I),(D-N),D]$

Since, 1+N/D=I+1−1+N/D=(I+1)−(D−N)/D, then $\Sigma\Delta[I,N,D] = C\Sigma\Delta[1,(D-N),D].$ Therefore, the Complement Sigma-Delta Modulator, as described above in FIG. 10, can be programmed to perform the same function as the system described in FIG. 6 by deasserting the complement mode signal.

Figure 12:
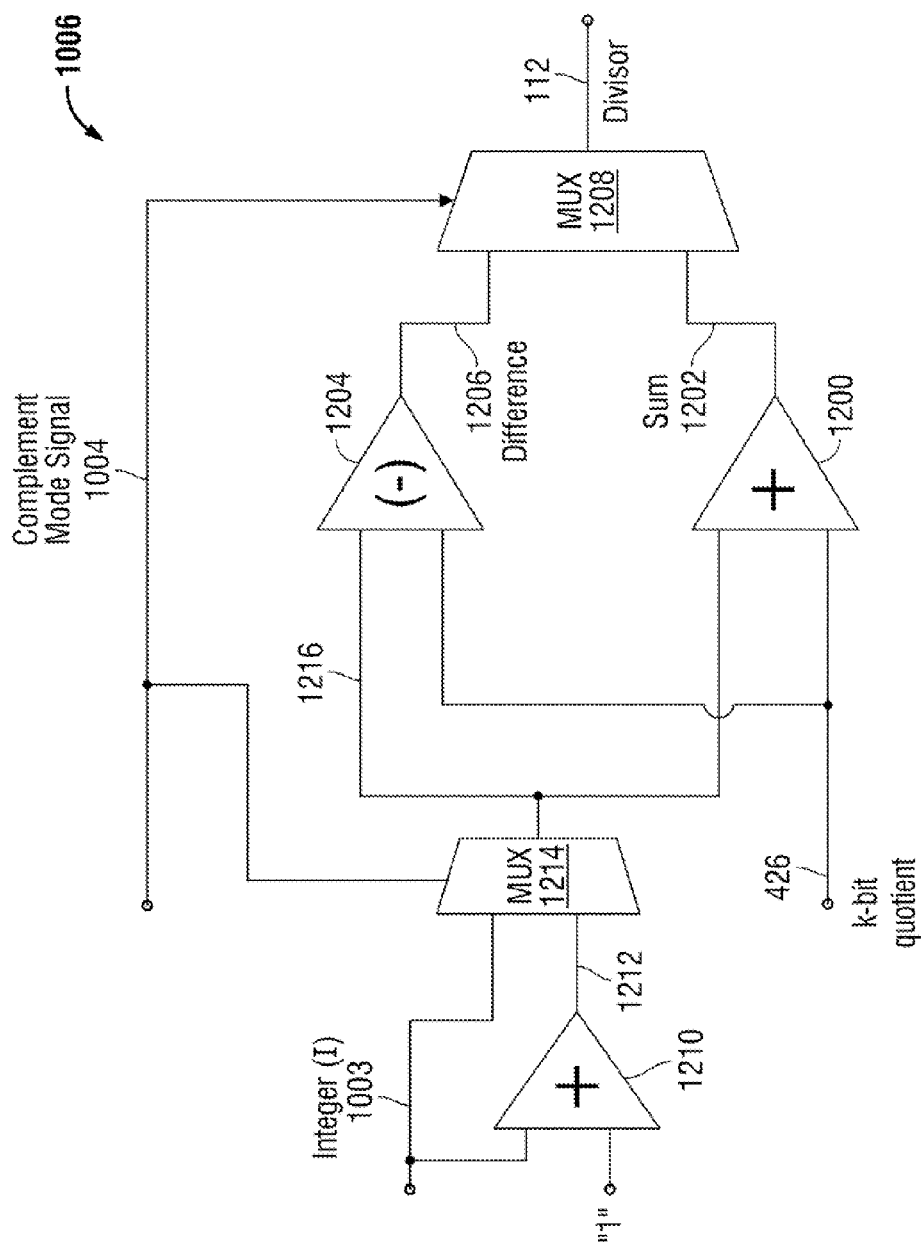
FIG. 12 is a more detailed depiction of the complement summing module of FIG. 10.

FIG. 12 is a more detailed depiction of the complement summing module of FIG. 10. A summing module 1210 accepts the integer (I) on line 1003, sums integer (I) with "1", and supplies the sum (I+1) on line 1212. MUX 1214 selects between line 1212 (I+1) and line 1003 (I) in response to the complement mode signal on line 1004, and supplies the output on line 1216. Summing module 1200 accepts the integer selection on line 1216, and the k-bit quotient on line 426, and supplies a sum of the 2 inputs on line 1202. A subtraction module 1204 accepts the integer selection on line 1216, and the k-bit quotient on line 426, and supplies a difference the 2 inputs on line 1206. MUX 1208 accepts the sum and difference and supplies one of the 2 inputs as the divisor on line 112, in response to the complement mode signal on line 1004.

Below is an example calculation.
Assuming that I=62, N=613, D=617, and X ($N_{max}$)=512. Since N>X, the complement operation is required.

$$62\frac{613}{617} = 62 + 1 - 1 + \frac{613}{617} = 68 - \frac{(617-618)}{617} = 68 - \frac{4}{617}$$

Figure 13A:
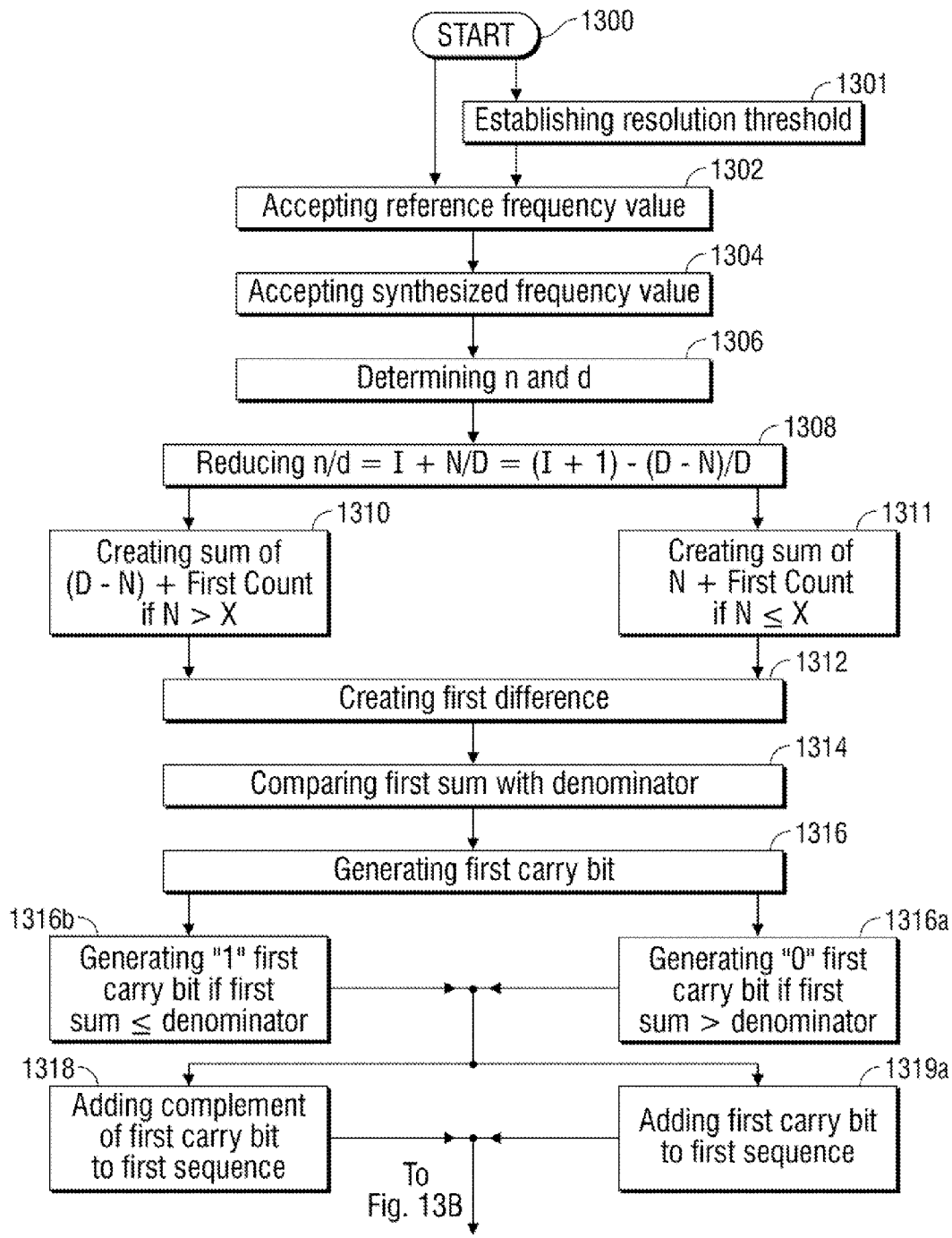
FIGS. 13A and 13B are flowcharts illustrating a method for synthesizing signal frequencies using low resolution rational division in a frequency synthesis device.
Figure 13B:
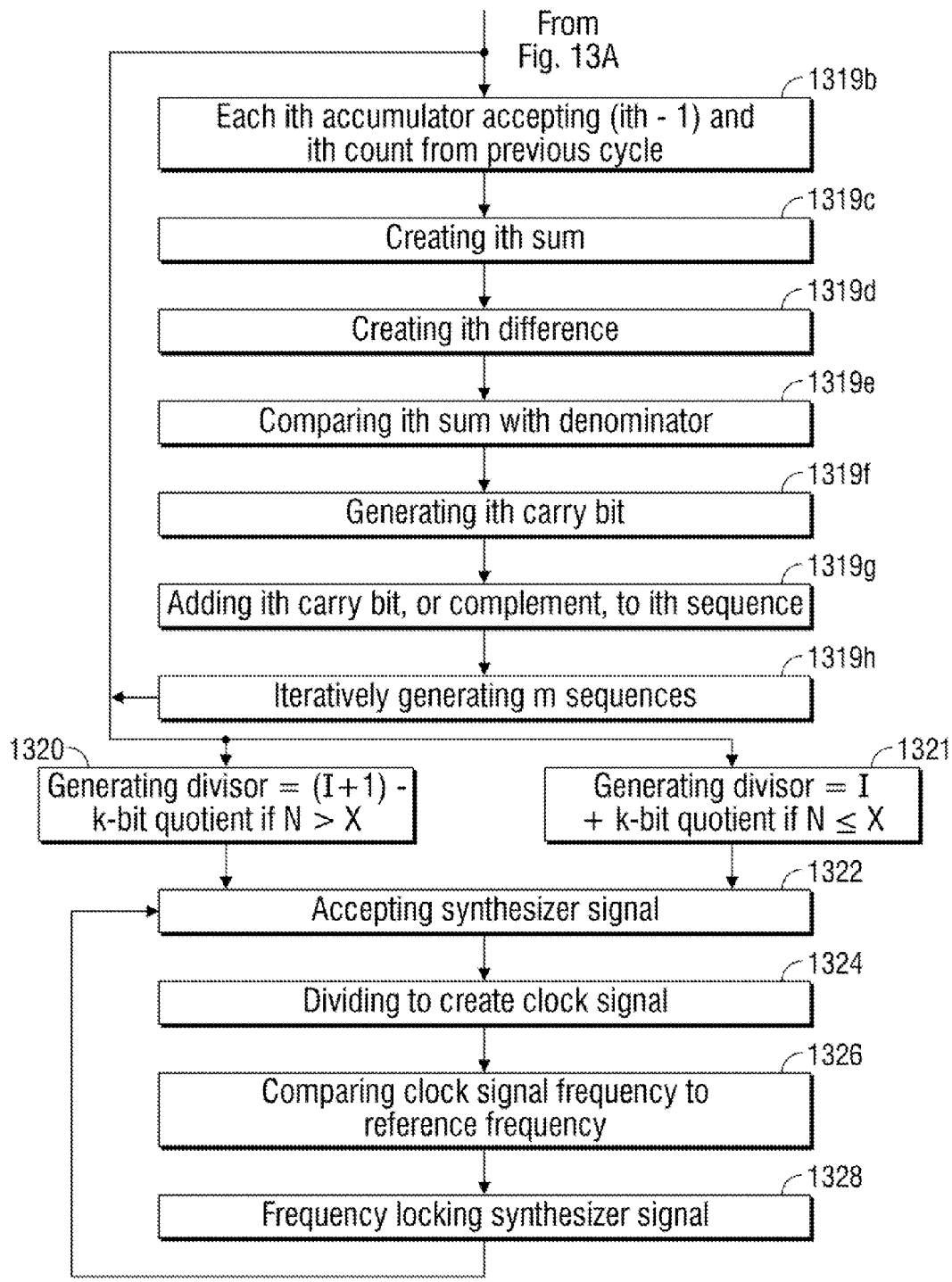

Here, the numerator (D−N) is 4, which is less than 512 (X), and $\Sigma\Delta[62,613,617] = C\Sigma\Delta[63,4,617].$ FIGS. 13A and 13B are flowcharts illustrating a method for synthesizing signal frequencies using low resolution rational division in a frequency synthesis device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally, however, the steps are performed in numerical order. The method starts at Step 1300.

Step 1302 accepts a reference frequency value. Step 1304 accepts a synthesized frequency value. In response to dividing the synthesized frequency value by the reference frequency value, Step 1306 determines an integer value numerator (n) and an integer value denominator (d). Step 1308 reduces the ratio of n/d to an integer (I) and a ratio of N/D, where n/d=I(N/D)=I+N/D=(I+1)−(D−N)/D), and where N/D<1. In a first flexible accumulator, Step 1310 creates a binary first sum of (D−N) and a binary first count from a previous cycle in a low resolution mode. Step 1312 creates a binary first difference between the first sum and the denominator. Step 1314 compares the first sum with the denominator. In response to the comparing, Step 1316 generates a first carry bit. In the low resolution mode, Step 1318 adds the complement of the first carry bit to a first binary sequence. Step 1320 uses the first binary sequence to generate a k-bit quotient, and Step 1322 subtracts the k-bit quotient from (I+1), in the low resolution mode, to generate a divisor.

Initially, the method may begin by establishing a resolution threshold of X bits ($N_{max}$) in Step 1301. Then, Step 1310 sums (D−N) with the first count, Step 1318 adds the complement of the first carry bit to the first binary sequence, and Step 1320 subtracts the k-bit quotient from (I+1) if N is resolved with greater than X bits. Alternatively, if N is resolved with X or fewer bits, Step 1311 creates a binary first sum of N and the binary first count from the previous cycle, Step 1319a adds the first carry bit to a first binary sequence, and Step 1321 adds the k-bit quotient to I to generate the divisor.

In one aspect, Step 1322 accepts a synthesizer signal having the nominal synthesized frequency. Step 1324 divides the synthesizer signal by the divisor to generate a clock signal. Step 1326 compares the clock signal frequency to a reference signal having the reference frequency. In response to the comparison, Step 1328 frequency locks and/or phase locks the synthesizer signal to the reference signal.

In another aspect, generating the first carry bit in Step 1316 includes the following substeps. Step 1316a generates a binary "1" first carry bit if the first sum is greater than the denominator. Alternatively, Step 1316b generates a binary "0" first carry bit if the first sum is less than or equal to the denominator. In response to comparing the first sum to the denominator, Step 1314 uses the first difference as the first count if the first sum is greater than the denominator. Alternatively, Step 1314 uses the first sum as the first count if the first sum is less than or equal to the denominator.

In one aspect, reducing the ratio of n/d to the integer (I) and the ratio of N/D in Step 1308 includes generating an n-bit binary numerator and an (n+1)-bit binary denominator. Alternately stated, (n) is the resolution threshold X. Then, creating the first sum in Steps 1310 or 1311 includes creating an (n+1)-bit first sum of the numerator and an n-bit first count from the previous cycle. Creating the first difference in Step 1312 includes creating an n-bit first difference.

One aspect includes a chain of (m−1) flexible accumulators linked to the first flexible accumulator. Then, in Step 1319b each ith flexible accumulator in the chain accepts an (ith−1) count from a previous cycle and an ith count from the previous cycle. Step 1319c creates a binary ith sum of the (ith−1) count and the ith count. Step 1319d creates a binary ith difference between ith sum and the denominator. Step 1319e compares the ith sum with the denominator. If the ith sum is greater than the denominator, Step 1319f generates a binary "1" ith carry bit, and uses the ith difference as the ith count for a subsequent cycle. Alternatively, if the ith sum is less than or equal to the denominator, Step 1319*f* generates a binary "0" ith carry bit, and uses the ith sum as the ith count for the subsequent cycle. Step 1319*g* acids the ith carry bit to an ith binary sequence if N is resolved with X or fewer bits, or adds the complement of the ith carry bit to the ith binary sequence if N is resolved with greater than X bits. Step 1319*h* iteratively generates m binary sequences, and Step 1320 uses the in binary sequences to generate the k-bit quotient.

A system and method have been provided that permit a frequency synthesis based upon either rational division using a low resolution nominator. Some examples of circuitry and methodology steps have been given as examples to illustrate the invention. However, the invention is not limited to merely these examples. Likewise, the invention has been described in the context of binary numbers. However, the invention is not limited to any particular number base. Other variations and embodiments of the invention will occur to those skilled in the art.

We claim:

1. In a frequency synthesis device, a method for synthesizing signal frequencies using low resolution rational division, the method comprising:
in a processor executing the following acts:
accepting a reference frequency value;
accepting a synthesized frequency value;
in response to dividing the synthesized frequency value by the reference frequency value, determining an integer value numerator (n) and an integer value denominator (d);
reducing a ratio of n/d to an integer (I) and a ratio of N/D, where n/d=I(N/D)=I+N/D=(I+1)−(D−N)/D), and where N/D<1;
in a first flexible accumulator, creating a binary first sum of (D−N) and a binary first count from a previous cycle, in a low resolution mode;
creating a binary first difference between the first sum and the denominator $\underline{D}$;
comparing the first sum with the denominator $\underline{D}$;
in response to the comparing, generating a first carry bit;
in the low resolution mode, adding the complement of the first carry bit to a first binary sequence;
using the first binary sequence to generate a k-bit quotient; and,
subtracting the k-bit quotient from (I+1), to generate a divisor, in the low resolution mode.

2. The method of claim 1 further comprising:
establishing a resolution threshold of X bits; and,
wherein creating the binary first sum of (D−N) and a binary first count from a previous cycle includes creating the first sum of (D−N) and the first count if N is resolved with greater than X bits;
wherein adding the complement of the first carry bit to the first binary sequence includes adding the complement of the first carry bit if N is resolved with greater than X bits; and,
wherein subtracting the k-bit quotient from (I+1) includes subtracting the k-bit quotient from (I+1) if N is resolved with greater than X bits.

3. The method of claim 2 further comprising:
if N is resolved with X or fewer bits, creating a binary first sum of N and the binary first count from the previous cycle;
if N is resolved with X or fewer bits, adding the first carry bit to a first binary sequence; and,
if N is resolved with X or fewer bits, adding the k-bit quotient to I to generate the divisor.

4. The method of claim 1 further comprising:
accepting a synthesizer signal having the nominal synthesized frequency;
dividing the synthesizer signal by the divisor to generate a clock signal;
comparing the clock signal frequency to a reference signal having the reference frequency; and,
in response to the comparison, frequency locking the synthesizer signal to the reference signal.

5. The method of claim 1 wherein generating the first carry bit includes:
generating a binary "1" first carry bit if the first sum is greater than the denominator $\underline{D}$; and,
generating a binary "0" first carry bit if the first sum is less than or equal to the denominator $\underline{D}$.

6. The method of claim 5 wherein comparing the first sum to the denominator includes:
using the first difference as the first count if the first sum is greater than the denominator $\underline{D}$; and,
using the first sum as the first count if the first sum is less than or equal to the denominator $\underline{D}$.

7. The method of claim 6 further comprising:
in a chain of (m−1) flexible accumulators linked to the first flexible accumulator, each ith flexible accumulator in the chain accepting an (ith−1) count from a previous cycle and an ith count from the previous cycle;
creating a binary ith sum of the (ith−1) count and the ith count;
creating a binary ith difference between ith sum and the denominator $\underline{D}$;
comparing the ith sum with the denominator $\underline{D}$;
if the ith sum is greater than the denominator $\underline{D}$:
generating a binary "1" ith carry bit; and,
using the ith difference as the ith count for a subsequent cycle; and,
if the ith sum is less than or equal to the denominator $\underline{D}$:
generating a binary "0" ith carry bit; and,
using the ith sum as the ith count for the subsequent cycle;
adding the ith carry bit to an ith binary sequence if N is resolved with X or fewer bits, and a complement of the ith carry bit to the ith binary sequence if N is resolved with greater than X bits;
iteratively generating m binary sequences; and,
wherein generating the k-bit quotient includes using the m binary sequences to generate the k-bit quotient.

8. The method of claim 1 wherein reducing the ratio of n/d to the integer (I) and the ratio of N/D includes generating an n-bit binary numerator and an (n+1)-bit binary denominator;
wherein creating the first sum includes creating an (n+1)-bit first sum of the numerator and a n-bit first count from the previous cycle; and,
wherein creating the first difference includes creating an n-bit first difference.

9. A device for synthesizing signal frequencies using low resolution rational division, the device comprising:
a processor comprising:
a calculator module having inputs to accept a reference frequency value and a synthesized frequency value, the calculator module dividing the synthesized frequency value by the reference frequency value, determining an integer value numerator (n) and an integer value denominator (d), and reducing a ratio of n/d to an integer (I) and a ratio of N/D, where n/d=I(N/D)=I+N/D=(I+1)−(D−N)/D), and where N/D<1, the calculator module having an output to supply a low resolution ratio, an output to supply the integer, and an output to supply a complement mode signal;

a first flexible accumulator having an input to accept the low resolution ratio and an input to accept the complement mode signal, the first flexible accumulator:
in a low resolution mode, creating a binary first sum of (D−N) and a binary first count from a previous cycle;
creating a binary first difference between the first sum and the denominator D;
comparing the first sum with the denominator D;
in response to the comparing, generating a first carry bit;
in response to complement mode signal, adding the complement of the first carry bit to a first binary sequence;
a quotientizer having an input to accept the first binary sequence and an output to supply a k-bit quotient; and,
a complement summing module having an input to accept the k-bit quotient, an input to accept the integer, and an input to accept the complement mode signal, the complement summing module subtracting the k-bit quotient from (I+1) to supply a divisor at an output, in response to the complement mode signal.

10. The device of claim 9 wherein the calculator module has an input to accept a resolution signal for establishing a resolution threshold of X bits, the calculator module for establishing the low resolution mode and supplying the complement mode signal in response to the numerator being resolved with greater than X bits.

11. The device of claim 10 wherein the calculator module supplies a non-complement mode signal in response to the numerator being resolved with X, or fewer bits;
wherein the first flexible accumulator creates a binary first sum of N and the binary first count from a previous cycle, and adds the first carry bit to the first binary sequence in response to the non-complement mode signal; and,
wherein the complement summing module adds the k-bit quotient to I, to generate the divisor, in response to the non-complement mode signal.

12. The device of claim 9 further comprising:
a phase-locked loop (PLL) including a phase/frequency detector (PFD), frequency synthesizer, and feedback loop divider, the PFD accepting a reference signal having a frequency equal to the reference frequency value and the frequency synthesizer generating a synthesized signal having a frequency nominally equal to the synthesized frequency value; and,
wherein the feedback loop divider has an input to accept the synthesized signal and an input to accept the divisor, the feedback loop divider dividing the synthesizer signal by the divisor to supply a clock signal; and,
wherein the PFD compares the clock signal frequency to the reference frequency, and in response to the comparison, locks the synthesizer signal to the reference signal.

13. The device of claim 9 wherein the first flexible accumulator includes:
a first summer having an input to accept a binary numerator, an input to accept the first count from a previous cycle, and an output to supply the first sum of the numerator and the first count;
a first subtractor having an input to accept a binary denominator, and input to accept the first sum, and an output to supply the first difference between the first sum and the denominator D;
a first comparator having an input to accept the first sum, an input to accept the denominator D, and an output to supply a first comparator signal;
a first multiplexer (MUX) having an input to accept carry bits, a control input to accept the first comparator signal, and an output to supply the first carry bit in response to the first comparator signal; and,
a second MUX having an input to accept the first carry bit, an input to accept a complement of the first carry bit, and a control input to accept the complement mode signal, the second MUX adding the complement of the first carry bit to the first binary sequence in response to the complement mode signal, and adding the first carry bit to the first binary sequence in response to the non-complement mode signal.

14. The device of claim 9 wherein the first flexible accumulator generates a binary "1" first carry bit if the first sum is greater than the denominator D, and generates a binary "0" first carry bit if the first sum is less than or equal to the denominator D.

15. The device of claim 14 wherein the first flexible accumulator uses the first difference as the first count if the first sum is greater than the denominator D, and uses the first sum as the first count if the first sum is less than or equal to the denominator D.

16. The device of claim 15 further comprising:
a chain of (m−1) flexible accumulators linked to the first flexible accumulator, each ith flexible accumulator in the chain:
accepting an (ith−1) count from a previous cycle and an ith count from the previous cycle;
creating a binary ith sum of the (ith−1) count and the ith count;
creating a binary ith difference between ith sum and the denominator D;
comparing the ith sum with the denominator D;
if the ith sum is greater than the denominator D:
generating a binary "1" ith carry bit; and,
using the ith difference as the ith count for a subsequent cycle; and,
if the ith sum is less than or equal to the denominator D:
generating a binary "0" ith carry bit; and,
using the ith sum as the ith count for the subsequent cycle;
adding a carry bit selected from a group consisting of the ith carry bit and a complement of the ith carry bit, to an ith binary sequence, in response a signal respectively selected from a group consisting of the complement mode signal and the non-complement mode signal; and,
wherein the quotientizer accepts m iteratively generated binary sequences and uses the m binary sequences to generate the k-bit quotient.

17. The device of claim 9 wherein the calculator module generates an n-bit binary numerator and an (n+1)-bit binary denominator; and,
wherein the first flexible accumulator creates an (n+1)-bit first sum of the numerator, an n-bit first count from the previous cycle, and an n-bit first difference.

18. A frequency synthesis device, for synthesizing signal frequencies using low resolution rational division, the device comprising:
a processor comprising:
a means for dividing a synthesized frequency value by a reference frequency value, determining an integer value numerator (n) and an integer value denominator (d), and reducing a ratio of n/d to an integer (I) and a ratio of N/D, where n/d=I(N/D)=I+N/D=(I+1)−(D−N)/D), and where N/D<1;
a means for creating a binary first sum of (D−N) and a binary first count from a previous cycle, in a low resolution mode;

a means for creating a binary first difference between the first sum and the denominator D;
a means for comparing the first sum with the denominator D;
a means for generating a first carry bit in response to the comparing;
a means for adding the complement of the first carry bit to a first binary sequence in the low resolution mode;
a means for using the first binary sequence to generate a k-bit quotient; and,
a means for subtracting the k-bit quotient from (I+1) to generate the divisor, in the low resolution mode.

* * * * *